United States Patent
Hsiao et al.

(10) Patent No.: US 7,086,918 B2
(45) Date of Patent: Aug. 8, 2006

(54) LOW TEMPERATURE PROCESS FOR PASSIVATION APPLICATIONS

(75) Inventors: Mark Hsiao, Tracy, CA (US); Takako Takehara, Hayward, CA (US); Quanyuan Shang, Saratoga, CA (US); William R. Harshbarger, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 181 days.

(21) Appl. No.: 10/317,774

(22) Filed: Dec. 11, 2002

(65) Prior Publication Data

US 2004/0113542 A1    Jun. 17, 2004

(51) Int. Cl.
*H01J 9/00*    (2006.01)
*H01J 9/24*    (2006.01)

(52) U.S. Cl. .......................................... 445/24; 445/25

(58) Field of Classification Search ............ 445/23–25, 445/14; 313/503–506, 511–512, 25
See application file for complete search history.

(56) References Cited

U.S. PATENT DOCUMENTS

| | | | | |
|---|---|---|---|---|
| 3,710,167 A * | 1/1973 | Dresner et al. | ............. | 313/504 |
| 4,539,507 A | 9/1985 | VanSlyke et al. | | |
| 5,247,190 A | 9/1993 | Friend et al. | | |
| 5,256,509 A | 10/1993 | Hayashi et al. | ............... | 430/66 |
| 5,707,745 A | 1/1998 | Forrest et al. | | |
| 5,855,994 A * | 1/1999 | Biebuyck et al. | ........... | 428/209 |
| 5,952,778 A * | 9/1999 | Haskal et al. | ............... | 313/504 |
| 6,255,774 B1 | 7/2001 | Pichler | | |
| 6,337,492 B1 | 1/2002 | Jones et al. | | |
| 6,392,250 B1 | 5/2002 | Aziz et al. | | |
| 6,392,339 B1 | 5/2002 | Aziz et al. | | |
| 6,402,579 B1 | 6/2002 | Pichler et al. | | |
| 6,436,222 B1 * | 8/2002 | Andre et al. | ............. | 156/272.8 |
| 6,552,488 B1 | 4/2003 | Roitman et al. | ............ | 313/512 |
| 6,646,373 B1 * | 11/2003 | Su | ............................. | 313/512 |

(Continued)

FOREIGN PATENT DOCUMENTS

| | | |
|---|---|---|
| JP | 2000077183 | 3/2000 |
| JP | 2000223264 | 8/2000 |
| JP | 2001126864 | 5/2001 |

(Continued)

OTHER PUBLICATIONS

Rajeswaran et al., 2001, "Fundamentals of OLED displays," *Society for Information Dislplay*, 1-154.

(Continued)

*Primary Examiner*—Joseph Williams
*Assistant Examiner*—Kevin Quarterman
(74) *Attorney, Agent, or Firm*—Shirley L. Church

(57) ABSTRACT

An organic electroluminescent device comprising an anode layer on a substrate, an organic layer on the anode layer, and a cathode layer on the organic layer. In one embodiment, the cathode layer is subjected to $H_2$ plasma prior to deposition of a protective layer over the cathode. In another embodiment, the organic electroluminescent device is encapsulated with an inner encapsulation layer on the cathode layer, and an outer encapsulation layer on the inner encapsulation layer. The inner layer is optimized for adhesion to the cathode layer.

29 Claims, 3 Drawing Sheets

U.S. PATENT DOCUMENTS

| | | | |
|---|---|---|---|
| 6,692,326 B1 * | 2/2004 | Choi et al. | 445/24 |
| 6,743,524 B1 * | 6/2004 | Schaepkens | 428/689 |
| 6,770,562 B1 * | 8/2004 | Yamazaki et al. | 438/679 |
| 6,781,305 B1 * | 8/2004 | Fujii | 313/504 |
| 6,878,297 B1 * | 4/2005 | Berger et al. | 216/17 |
| 2003/0164677 A1 | 9/2003 | Miyaguchi et al. | 313/504 |

FOREIGN PATENT DOCUMENTS

| | | |
|---|---|---|
| JP | 2002134270 | 5/2002 |

OTHER PUBLICATIONS

Burrows et al., 2000, "Gas permeation and lifetime tests on polymer-based barrier coatings," *SPIE Annual Meeting, Invited Paper*, 1-9.

Copy of Search Report in corresponding PCT Application No. PCT/US93/39385.

* cited by examiner

LOW TEMPERATURE PROCESS FOR PASSIVATION APPLICATIONS

1. FIELD OF THE INVENTION

The present invention relates to improved organic electroluminescent devices and improved methods for manufacturing organic electroluminescent devices. Organic electroluminescent devices include organic light-emitting diodes and polymer light-emitting diodes. They are used in a number of devices, such as car radios, mobile phones, digital cameras, camcorders, and personal digital assistants.

2. BACKGROUND OF THE INVENTION

Over the past two decades, new flat panel display technology based on light emission from thin layers of small organic molecules (organic light-emitting diodes or OLEDs) or conducting polymers (polymer light-emitting diodes or PLEDs) has emerged. Compared to liquid crystal-based displays (LCDs), this technology offers higher contrast displays with lower power consumption, and response times fast enough for video applications. Displays based on OLED and PLED technology exhibit a much wider viewing angle than liquid crystal displays (LCDs). Currently, more than seventy companies worldwide are developing display technologies based on OLED or PLED structures. Sales of displays based on OLEDs, such as car radios, mobile phones, digital cameras, camcorders, personal digital assistants, navigation systems, games, and subnotebook personal computers, are forecast to grow to more than one billion dollars in 2005.

The basic device configuration for both OLEDs and PLEDs is a multilayered or sandwich-type structure comprising a glass substrate, a transparent anode, two or more organic layers with different charge transport or luminescence characteristics, and a metal cathode. The morphology of the organic layers typically ranges from semi-crystalline to amorphous. Unlike inorganic LEDs, there are no lattice matching requirements with OLEDs and PLEDs, which greatly widens the types of substrates that can be used and the types of materials that can be combined together into devices. Use of multiple organic layers in the device geometry facilitates charge injection at the organic-electrode interface, leading to lower driving voltages. In addition, use of multiple organic layers allows the buildup of electrons and holes (and therefore, the location of the emission zone) to occur away from the electrodes, which significantly improves the efficiency of the device.

A typical organic light emitting device 30 in accordance with the prior art is shown in FIG. 1. The organic light emitting device 30 comprises a substrate 32, an anode 34 on the substrate 32, a hole transport region 36 composed of a hole transport material (HTM) on the anode 34, a mixed region 38 comprising a mixture of a hole transport material and an electron transport material on the hole transport region 36, an electron transport region 40 composed of an electron transport material (ETM) on the mixed region 38, a cathode 42 on the electron transport region 40, and a protective layer 44 on cathode 42. Not all electroluminescent devices have precisely the layers shown in the organic light emitting device 30 of FIG. 1. For convenience, the term "organic layer" used hereinafter to refer to multi-layer structures such as that of regions 36, 38, 40 as well as all structures of one or more organic layers that are equivalent to regions 36, 38, and 40. In the mixed region 38, one of the hole transport material and the electron transport material is an emitter. Upon application of an electrical current, the organic electroluminescent device radiates light generated by recombination of electrons and holes in the organic materials used to make regions 36, 38, and 40.

Hole transport materials used to form hole transport region 36 and mixed region 38 are typically a conductive material such as polyaniline, polypyrrole, poly(phenylene vinylene), porphyrin derivatives disclosed in U.S. Pat. No. 4,356,429, which is incorporated herein by reference in its entirety, copper phthalocyanine, copper tetramethyl phthalocyanine, zinc phthalocyanine, titanium oxide phthalocyanine, magnesium phthalocyanine, or mixtures thereof. Additional hole transporting materials include aromatic tertiary amines, polynuclear aromatic amines, as well as other compounds which are disclosed in U.S. Pat. No. 4,539,507 and U.S. Pat. No. 6,392,339, which are incorporated herein by reference in their entirety. The hole transport material may be deposited on the anode by, for example, plasma enhanced chemical vapor deposition (PECVD), atmospheric pressure chemical vapor deposition (CVD), sputtering, or spin-coating. See, for example, Van Zant, *Microchip Fabrication*, McGraw-Hill, 2000, which is incorporated herein by reference in its entirety.

Illustrative examples of electron transport materials that can be utilized in mixed region 38 and electron transport region 40 include, but are not limited to, the metal chelates of 8-hydroxyquinoline, as disclosed in U.S. Pat. Nos. 4,539,507; 5,151,629; 5,150,006 and 5,141,671, each incorporated herein by reference in its entirety. Another class of electron transport materials used in electron transport region 40 and mixed region 38 comprises stilbene derivatives, such as those disclosed in U.S. Pat. No. 5,516,577, incorporated herein by reference in it entirety. Another class of electron transport materials are metal thioxinoid compounds, illustrated in U.S. Pat. No. 5,846,666, incorporated herein by reference in its entirety. Yet another class of suitable electron transport materials for forming the electron transport region 40 and the mixed region 38 are the oxadiazole metal chelates disclosed in U.S. Pat. No. 6,392,339.

In some instances, mixed region 38 comprises from about 10 weight percent to about 90 weight percent of the hole transport material and from about 90 weight percent to about 10 weight percent of the electron transport material. The mixed region can be formed using mixtures of any of the suitable exemplary hole transport materials and electron transport materials described above, or other suitable materials known in the art. The mixed region 38 can be formed by any suitable method that enables the formation of selected mixtures of hole transport materials and electron transport materials. For example, the mixed region can be formed by co-evaporating a hole transport material and an electron transport material to form a mixed region. The thickness of the mixed region 38 affects the operational voltage and the luminance of the organic light emitting device. Mixed region 38 can comprise more than one layer. For example, mixed region 38 can selectively be formed to include two, three or even more separate layers.

Cathode 42 comprises any suitable metal, including high work function components, having a work function, for example, from about 4.0 eV to about 6.0 eV, or low work function components, such as metals with, for example, a work function of from about 2.5 eV to about 4.0 eV.

While FIG. 1 shows the basic structure of an OLED, variations of the structure shown in FIG. 1 are known. Such variations are disclosed in patents such as U.S. Pat. No. 4,356,429; U.S. Pat. No. 5,593,788; U.S. Pat. No. 5,408,109;

U.S. Pat. No. 6,255,774; and U.S. Pat. No. 6,402,579; which are incorporated herein by reference in their entirety.

The organic luminescent materials used to make layers 36, 38, and 40, are sensitive to contamination, oxidation, and humidity. Furthermore, in some OLEDs, electrodes 34 and 42 are also sensitive to contamination, oxidation, and humidity. In the prior art, protective layer 44 actually comprises a glass or metal lid, which is attached to substrate 32 using a bead of UV-cured epoxy. Such an encapsulation technique is unsatisfactory. For example, an encapsulating lid requires additional bracing or standoffs for sizes greater then twelve centimeters on the diagonal.

U.S. Pat. No. 5,952,778 to Haskal et al. attempts to address the need in the art for encapsulating OLEDs in order to prolong device life. Haskal et al. disclose a three-layer protective covering. The first layer, nearest the cathode, is made of a stable metal such as gold, silver, aluminum or indium that is deposited by thin film deposition techniques. The second layer comprises a dielectric material such as silicon oxide or silicon nitride deposited by thermal or chemical vapor deposition. The third layer of the protective covering comprises a hydrophobic polymer such as siloxane or Teflon®. The three-layer protective covering described by Haskal et al. is unsatisfactory, however, because it is time consuming to manufacture the coverings described by Haskal et al.

Therefore, there is still a need in the art for techniques and methods for encapsulating organic electroluminescent devices such as OLEDs and PLEDs.

3. SUMMARY OF THE INVENTION

The present invention provides organic electroluminescent devices that have improved encapsulation properties. The present invention further provides improved methods for encapsulating such devices. In some embodiments of the present invention, a multilayer encapsulation approach is taken. In some embodiments, each encapsulation layer has the same properties. In other embodiments, the first encapsulation layer is optimized for adhesion to an electrode layer in the device. Subsequent encapsulation layers help protect the device from environmental elements such as moisture. In some embodiments, the first (inner) encapsulation layer is a silicon rich silicon nitride film while one or more outer encapsulation layers are silicon nitride films that have low etch rates. The silicon rich silicon nitride films of the present invention have good adhesion properties. Further, the present invention provides a method for improving adhesion to the cathode layer of electroluminescent devices.

Silicon nitride deposition is typically performed in a PECVD chamber at temperatures that would cause damage to the organic layers of the electroluminescent device. However, using the techniques of the present invention, electroluminescent devices are encapsulated using PECVD or related techniques without damaging the organic layers of the electroluminescent device. This is achieved, in part, by cycling the deposition process between an active deposition state and an inactive cooling state. The inactive cooling state allows the device substrate to cool so that the integrity of the organic layer of the device is not lost.

One aspect of the present invention provides a method of fabricating an organic electroluminescent device. In the method, the cathode layer of the device is subjected to an $H_2$ plasma. Then, one or more protective layers, such as silicon nitride layers, are deposited on the cathode layer. In some embodiments, the organic electroluminescent device is an organic light-emitting diode or a polymer light-emitting diode. In some embodiments, the cathode layer is subjected to the $H_2$ plasma in a plasma enhanced chemical vapor deposition (PECVD) chamber for a period of four minutes to seven minutes.

Another aspect of the present invention provides an organic electroluminescent device that includes a substrate, an anode layer on the substrate, an organic layer on the anode layer, and a cathode layer on the organic layer. Further, the cathode layer is subjected to an $H_2$ plasma prior to the deposition of one or more protective layers on the cathode layer. In some embodiments, the organic electroluminescent device is an organic light-emitting diode or a polymer light-emitting diode. In some embodiments, the device cathode layer is subjected to an $H_2$ plasma prior to deposition of the protective layers in a plasma enhanced chemical vapor deposition (PECVD) chamber by exposing the cathode layer to the $H_2$ plasma for a period of up to ten minutes. In some embodiments, the cathode layer is subjected to an $H_2$ plasma prior to deposition of one or more protective layers in a PECVD chamber by exposing the cathode layer to the $H_2$ plasma for a period of four minutes to seven minutes. In some embodiments, the RF power of the PECVD chamber during at least a portion of this exposure is between about 0.025 watts/cm$^2$ and about 0.5 watts/cm$^2$, the pressure of the PECVD chamber is between about 0.3 Torr and about 1 Torr, and the $H_2$ gas is supplied to the PECVD chamber at a flow rate of about 100 standard cubic centimeters per minute (sccm) to about 10 standard liters per minute.

Yet another aspect of the present invention is an organic electroluminescent device that includes a substrate, an anode layer on the substrate, an organic layer on the anode layer, a cathode layer on the organic layer, an inner encapsulation layer on the cathode layer, and an outer encapsulation layer on the inner encapsulation layer. In some embodiments in accordance with this aspect of the invention, the inner encapsulation layer has the same properties as the outer encapsulation layer. In other embodiments in accordance with this aspect of the invention, the inner encapsulation layer and the outer encapsulation layers have different properties. In one instance, for example, the inner encapsulation layer is optimized for adhesion to the cathode layer and the outer encapsulation layer is optimized for moisture protection. In some embodiments, the inner encapsulation layer is a silicon nitride film having a refractive index of about 1.95 or greater and the outer encapsulation layer is a silicon nitride film having a refractive index of about 1.90 or less. In some embodiments, the inner and/or outer encapsulation layer has a water transmission rate of less than $5 \times 10^{-3}$ g/m$^2$/day at about 25° C. In some embodiments of the present invention, the inner encapsulation layer is deposited onto the cathode layer in a PECVD chamber with a deposition process that comprises at least one iteration of (i) an active step in which the power in the PECVD chamber is about $C_1 \times 1500$ watts to about $C_1 \times 2500$ watts, where $C_1 =$ [size of the PECVD susceptor/200,000 mm$^2$] and the flow rate of silane gas into the PECVD chamber is one relative unit, the flow rate of ammonia gas into the PECVD chamber is less than five relative units, and the flow rate of nitrogen gas into the PECVD chamber is at least five relative units and, (ii) a cooling step in which the power in the PECVD chamber is less than $C_1 \times 1500$ watts. In some embodiments, each instance of the active step has a duration of about 5 to about 20 seconds and each instance of the inactive step has a duration of about 5 seconds or more.

Another aspect of the present invention provides a method of encapsulating an organic electroluminescent device having a cathode layer. The method comprises (A) depositing an inner encapsulation layer over the cathode layer and (B) depositing an outer encapsulation layer over the inner encapsulation layer. In some embodiments in accordance with this aspect of the invention, the inner encapsulation layer and the outer encapsulation layer have the same or similar physical properties. In other embodiments in accordance with this aspect of the invention, the inner encapsulation layer is optimized for adhesion to the cathode layer while the outer encapsulation layer helps protect the device from moisture. In some embodiments, the inner encapsulation layer is a silicon nitride film having a refractive index of about 1.95 or greater. In some embodiments the depositing step (A) is performed in a PECVD chamber or a chemical vapor deposition (CVD) chamber at an operating pressure of about 1.0 Torr to about 1.4 Torr. In some embodiments, the depositing step (A) is performed in a PECVD chamber and the power in the PECVD chamber in step (A) is about $C_1 \times 1500$ watts to about $C_1 \times 2500$ watts, where $C_1$=[size of the PECVD susceptor/200,000 mm$^2$]. In some embodiments the depositing step (A) is performed in a PECVD chamber. Further, in such embodiments, the flow rate of silane gas into the PECVD chamber during at least a portion of depositing step (A) is one relative unit. Further, the flow rate of ammonia gas into the PECVD chamber during at least a portion of depositing step (A) is less than five relative units and the flow rate of nitrogen gas into the PECVD chamber during at least a portion of depositing step (A) is at least five relative units.

In some embodiments, the inner encapsulation layer has a thickness of about 0.5 to about 2.5 µM and the outer encapsulation layer has a thickness of about 0.07 to about 0.22 µM. In some embodiments, the organic electroluminescent device is an organic light-emitting diode or a polymer light-emitting diode. In some embodiments, the organic electroluminescent device comprises an anode layer made of indium tin oxide (ITO), tin oxide, gold, platinum, electrically conductive carbon, a n-conjugated polymer, or a mixture thereof. In some embodiments of the invention, an organic layer in the electroluminescent device comprises polyaniline, polypyrrole, poly(phenylene vinylene), a porphyrin derivative, copper phthalocyanine, copper tetramethyl phthalocyanine, zinc phthalocyanine, titanium oxide phthalocyanine, magnesium phthalocyanine, an aromatic tertiary amine, a polynuclear aromatic amine, or a mixture thereof.

4. BRIEF DESCRIPTION OF THE DRAWINGS

Additional objects and features of the invention will be more readily apparent from the following detailed description and appended claims when taken in conjunction with the drawings, in which:

Like reference numerals refer to corresponding parts throughout the several views of the drawings.

5. DESCRIPTION OF THE PREFERRED EMBODIMENTS

The present invention provides methods for encapsulating electroluminescent devices in order to protect them from elements like moisture. Further, the present invention provides methods for improving adhesion to the cathode layer of electroluminescent devices. In particular, the cathode layer is subjected to an $H_2$ plasma for a period of time prior to deposition of materials onto the cathode layer in order to complete the electroluminescent device. Representative electroluminescent devices include organic light-emitting diodes (OLEDs) and polymer light-emitting diodes. Typically, the electroluminescent device is used in devices such as car radios, mobile phones, digital cameras, camcorders, and personal digital assistants.

Figure 1:
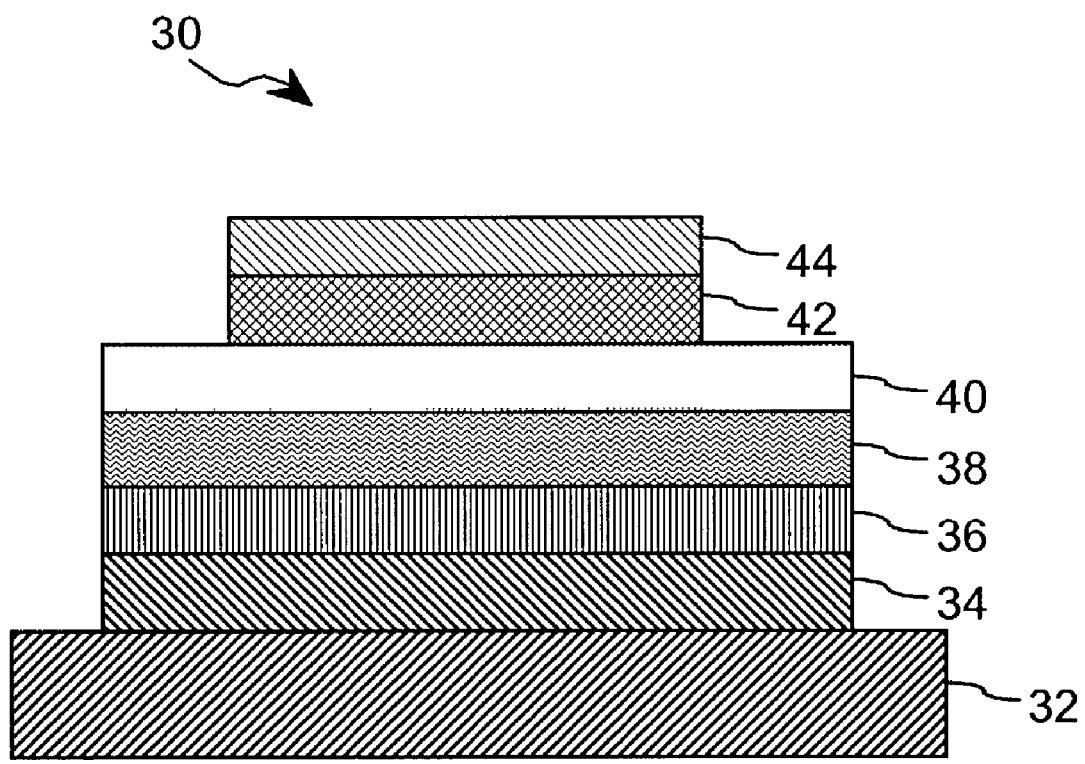
FIG. 1 illustrates an organic light-emitting diode (OLED) in accordance with the prior art.
Figure 2:
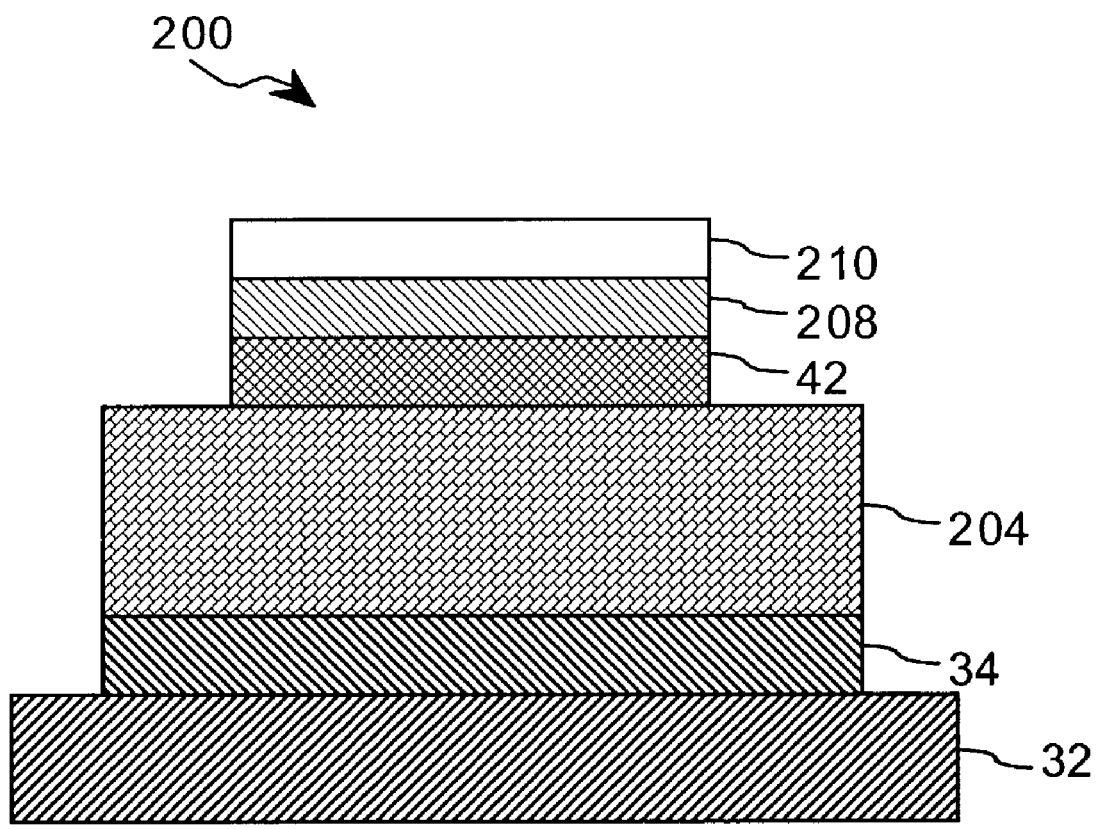
FIG. 2 illustrates an organic electroluminescent device in accordance with the present invention.

A typical electroluminescent device (e.g., OLED) in accordance with the present invention is illustrated in FIG. 2. The electroluminescent device 200 comprises a substrate 32, an anode 34 on substrate 32, an organic layer 204, a cathode layer 42 on organic layer 204, a first encapsulation layer 208 and a second encapsulation layer 210. In some embodiments, organic layer 204 includes a hole transport region, a mixed region, and a electron transport region as illustrated in FIG. 1. However, not all electroluminescent devices have precisely the layers shown in the organic layer of FIG. 1. Therefore, as noted above, the term "organic layer" as used herein encompasses multi-layer organic structures such as the one shown in FIG. 1 (e.g., regions 36, 38, and 40) as well as all structures of one or more layers that are equivalent to regions 36, 38, and 40 of FIG. 1 that are found in organic electroluminescent devices. Upon application of an electrical current, organic electroluminescent device 200 radiates light generated by recombination of electrons and holes in the organic materials used to make organic layer 204.

5.1 $H_2$ Plasma Treatment of the Anode Layer 34 Prior to Organic Layer 204 Deposition A first aspect of the present invention provides a novel $H_2$ plasma treatment of the upper layer of an electronic device having a flexible substrate. In some embodiments of the present invention, this upper layer is cathode layer 42 of organic electroluminescent device 200 (FIG. 2). It has been unexpectedly discovered that pretreatment of the upper layer of an electronic device having a flexible substrate (e.g., cathode layer 42 of organic electroluminescent device 200) with an $H_2$ plasma promotes adhesion of the subsequently deposited protective layer 44.

In particular, in one embodiment of the present invention, it has been unexpectedly discovered that subjecting the cathode layer 42 to $H_2$ plasma prior to depositing a silicon nitride protective coating prevents the silicon nitride layer from pealing. In some embodiments, cathode layer 42 is covered with a conventional protective coating, such as aluminum. In such embodiments, the aluminum is subjected to $H_2$ plasma prior to deposition of silicon nitride protective coating.

As a result of the unexpected discovery that exposure to an $H_2$ plasma prior to deposition of a silicon nitride protective coating prevents subsequent pealing of the protective coating, one aspect of the invention provides a method of fabricating an organic electroluminescent device such as an OLED. The method incorporates a step of $H_2$ plasma exposure. Throughout the description of the method, it is understood that either the cathode layer 42 or the cathode layer 42 which has been overlayed by a protective layer such as aluminum can be subjected to an $H_2$ plasma. In the first step, an anode material is deposited onto substrate 32. Substrate 32 may be made of any suitable material, such as glass or quartz. In one embodiment, substrate 32 is made of low-temperature, low-Na glass. In some embodiments, substrate 32 comprises a light transparent material such as a polymer, glass, quartz and the like. Suitable polymers include, but are not limited to, MYLAR®, polycarbonates, polyacrylates, polymethacrylates, and polysulfones. Mixtures of these various materials can also be used to form substrate 32. In some instances, substrate 32 is a transparent or substantially transparent glass plate or plastic film.

In some embodiments, the material used to form anode layer 34 comprises a suitable positive charge injecting electrode material such as indium tin oxide (ITO) or tin. Other suitable materials for anode 34 include, but are not limited to, electrically conductive carbon, π-conjugated polymers such as polyaniline, and polypyrrole. In some instances, anode layer 34 is a thin conductive layer that is coated onto substrate 32. Additional suitable forms of the anode layer 34 (and cathode layer 42) are disclosed in U.S. Pat. No. 4,885,211 and U.S. Pat. No. 6,392,339, which are incorporated herein by reference in their entirety.

After anode layer 34 has been formed, an organic layer 204 is applied to anode layer 34. In some embodiments, organic layer 204 comprises a hole transport region composed of a hole transport material (HTM) on anode layer 34, a mixed region comprising a mixture of a hole transport material and an electron transport material on the hole transport region, and an electron transport region composed of an electron transport material (ETM) on the mixed region. In some embodiments, hole transport material used to form the hole transport region and the mixed region is a conductive material such as polyaniline, polypyrrole, poly(phenylene vinylene), porphyrin derivatives disclosed in U.S. Pat. No. 4,356,429, incorporated herein by reference in its entirety; copper phthalocyanine, copper tetramethyl phthalocyanine, zinc phthalocyanine, titanium oxide phthalocyanine, magnesium phthalocyanine, or mixtures thereof. Additional hole transporting materials include aromatic tertiary amines, polynuclear aromatic amines, as well as other compounds that are disclosed in U.S. Pat. No. 4,539,507 and U.S. Pat. No. 6,392,339, which are incorporated herein by reference in their entirety. The hole transport material may be deposited on anode layer 34 by, for example, PECVD, atmospheric pressure CVD, sputtering, or spin-coating. See, for example, Van Zant, *Microchip Fabrication*, McGraw-Hill, 2000.

Illustrative examples of electron transport materials that can be utilized in the mixed region and the electron transport region include, but are not limited to, the metal chelates of 8-hydroxyquinoline as disclosed in U.S. Pat. Nos. 4,539,507; 5,151,629; 5,150,006 and 5,141,671, each incorporated herein by reference in its entirety. Another class of electron transport materials used in electron transport region 38 comprises stilbene derivatives, such as those disclosed in U.S. Pat. No. 5,516,577, incorporated herein by reference in it entirety. Another class of electron transport materials is metal thioxinoid compounds, illustrated in U.S. Pat. No. 5,846,666, incorporated herein by reference in its entirety. Yet another class of suitable electron transport materials for forming the electron transport region 40 and the mixed region 38 is the oxadiazole metal chelates disclosed in U.S. Pat. No. 6,392,339, incorporated herein by reference in its entirety.

After organic layer 204 has been formed on anode layer 34, cathode layer 42 is deposited onto organic layer 204. Cathode layer 42 comprises any suitable metal, including high work function components, having a work function, for example, from about 4.0 eV to about 6.0 eV, or low work function components, such as metals with, for example, a work function of from about 2.5 eV to about 4.0 eV. Cathode 42 can comprise a combination of a low work function (less than about 4 eV) metal and at least one other metal. Effective proportions of the low work function metal to the second or other metal are from less than about 0.1 weight percent to about 99.9 weight percent. Illustrative examples of low work function metals include, but are not limited to, alkaline metals such as lithium or sodium; Group 2A or alkaline earth metals such as beryllium, magnesium, calcium or barium; and Group III metals including rare earth metals and the actinide group metals such as scandium, yttrium, lanthanum, cerium, europium or actinium. Additional low work function materials include titanium, manganese, gallium, strontium, indium, praseodymium, neodymium, promethium, samarium, gadolinium, terbium, dysprosioum, holmium, erbium, thylium, ytterbium, lutetium, hafnium, radium, thorium, and uranium. Lithium, magnesium and calcium are preferred low work function metals. Additional materials used to make cathode layer 42 are disclosed in U.S. Pat. No. 4,885,211; U.S. Pat. No. 5,429,884; and U.S. Pat. No. 6,392,339, which are incorporated herein by reference in their entirety. The additional materials include higher work function materials, by example and not by way of limitation, such as boron, carbon, aluminum, vanadium, chromium, iron, cobalt, nickel, copper, zinc, germanium, arsenic, selenium, molybdenum, technetium, ruthenium, rhodium, palladium, silver, cadmium, tin, antimony, tellurium, tantalum, tungsten, rhenium, osmium, iridium, platinum, gold, mercury, lead, bismuth, and polonium.

After cathode layer 42 has been deposited, the layer is subjected to an $H_2$ plasma for a period of time. In some embodiments, a protective coating, such as an aluminum coating is deposited over cathode layer 42. In such embodiments, the protective coating is subjected to an $H_2$ plasma.

A plasma enhanced chemical vapor deposition (PECVD) reactor may be used to subject cathode layer 42 to an $H_2$ plasma. Such reactors are disclosed in Van Zant, *Microchip Fabrication*, McGraw-Hill, New York, 2000. Exemplary PECVD reactors that may be used in accordance with the present invention include barrel radiant-heated PECVDs, horizontal-tube PECVDs, and high density plasma CVDs. In addition, the AKT PECVD systems, including the 1600PECVD (e.g. the AKT PECVD 1600 B version, substrate size 400×500), 3500PECVD, 4300PECVD, 5500PECVD, PECVD 10K, PECVD 15K, and PECVD 25K may be used (Applied Materials, Santa Clara, Calif.).

Figure 3:
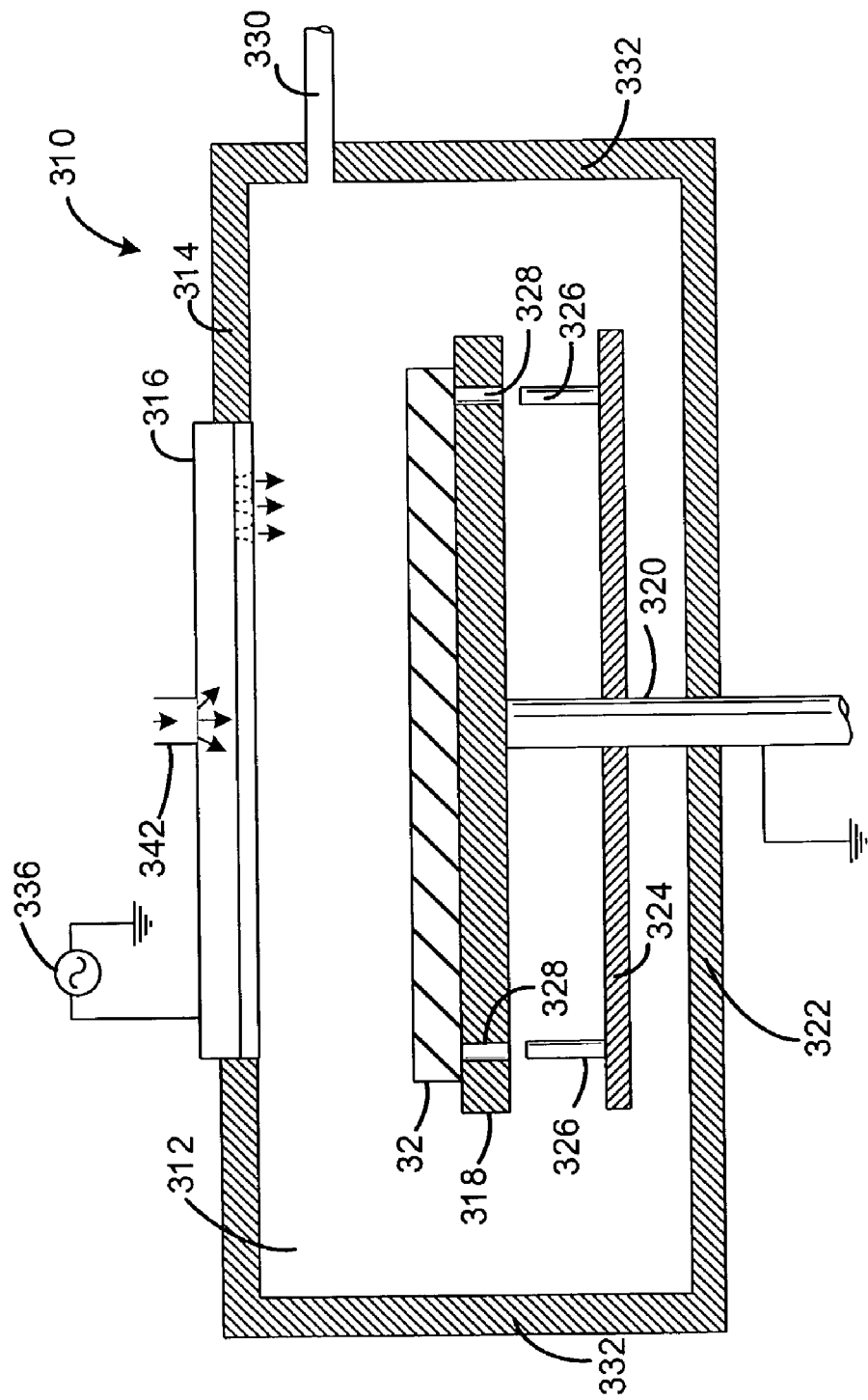
FIG. 3 illustrates a plasma enhanced chemical vapor deposition chamber in accordance with the prior art.

FIG. 3 illustrates an exemplary PECVD reactor 310 that may be used in accordance with the methods of the present invention. Reactor 310 includes a deposition chamber 312 that has an opening across a top wall 314 as well as a first electrode 316 within the opening. In some instances, electrode 316 is a gas inlet manifold while in other instances, wall 314 is solid and electrode 316 is adjacent to the inner surface of top wall 314.

Within chamber 312 there is a susceptor 318 in the form of a plate that extends parallel to electrode 316. Susceptor 318 is connected to ground so that it serves as a second electrode. Susceptor 318 is mounted on the end of a shaft 320 that extends vertically through a bottom wall 322 of deposition chamber 312. Shaft 320 is movable vertically so as to permit the movement of susceptor 318 vertically toward and away from electrode 316. A lift-off plate 324 extends horizontally between susceptor 318 and a bottom wall 322 of deposition chamber 312 substantially parallel to susceptor 318. Lift-off pins 326 project vertically upwardly from lift-off plate 324. The lift-off pins 326 are positioned to be able to extend through holes 328 in susceptor 318, and are of a length slightly longer than the thickness of the susceptor 318.

A gas outlet 330 extends through a side wall 332 of deposition chamber 312. Gas outlet 330 is connected to means (not shown) for evacuating the deposition chamber 312. A gas inlet pipe 342 extends through the first electrode or the gas inlet manifold 316 of the deposition chamber 312, and is connected through a gas switching network (not shown) to sources (not shown) of various gases. Electrode 316 is connected to a power source 336. Power source 336 is typically an RF power source.

In the operation of PECVD reactor 310, a substrate 32 is first loaded into deposition chamber 312 and is placed on susceptor 318 by a transfer plate (not shown). One size of substrate for organic electroluminescent device substrates is a 400 mm by 500 mm glass panel. However, substrates 32 processed by deposition apparatus 310 may in fact be any size, such as 550 mm by 650 mm, 650 mm by 830 mm, 1000 mm by 1200 mm or larger.

The length of time cathode layer 42 (or cathode layer 42 which has been overlayed with a protective layer of a material such as aluminum) is subjected to an $H_2$ plasma depends on the exact specifications of the cathode layer 42. It will be appreciated that, in the interest of expediting the manufacture of electroluminescent devices, effective short exposures to the $H_2$ plasma are more desirable than longer $H_2$ exposures. Accordingly, in one embodiment, the cathode layer 42 is exposed to an $H_2$ plasma in a PECVD chamber for a period of up to ten minutes. In other embodiments, cathode layer 42 is exposed to an $H_2$ plasma in a PECVD chamber for a period of about four minutes to about seven minutes. However, $H_2$ plasma exposures of any length of time are contemplated by the present invention provided that such exposures are effective at preventing the peeling of a subsequently applied protective layer 44 over cathode layer 42, such that the exposures does not damage the device. Exemplary protective layers include, but are not limited to, silicon nitride.

In embodiments where a PECVD chamber is used to expose cathode layer 42 to an $H_2$ plasma, a radio-frequency-induced glow discharge, or other plasma source is used to induce a plasma field in the $H_2$ gas. In embodiments where a radio-frequency-induced glow discharge is used to generate $H_2$ plasma, the radio-frequency (RF) power during at least a portion of the exposing step is between about 50 watts and about 1 kilowatt when the substrate size is 400 mm×500 mm (i.e., 0.025 watts/cm$^2$ to 0.5 watts/cm$^2$). In some embodiments, the RF power that is used to support the RF $H_2$ plasma is in the range of about 100 watts to about 500 watts when the substrate size is 400 mm×500 mm. Larger substrate sizes will require more power, such as 0.5, 1, 1.5 or 2 watts/cm$^2$ or more.

In embodiments where a PECVD chamber is used to expose cathode layer 42 to an $H_2$ plasma, the pressure of the chamber is below atmospheric pressure. In fact, in one embodiment of the present invention, the pressure of the PECVD chamber during at least a portion of the period of time in which cathode layer 42 is exposed to $H_2$ plasma is less than 10 Torr. More typically, the pressure is between about 1 Torr and about 4 Torr or less. In some embodiments, the pressure is between about 0.3 Torr and about 1 Torr. In embodiments where a PECVD chamber is used to expose cathode layer 42 to an $H_2$ plasma, $H_2$ gas is supplied to the chamber at a flow rate of about 100 standard cubic centimeters per minute to about 10 standard liters per minute during at least a portion of the period of time in which cathode layer 42 is exposed to $H_2$ plasma. In one embodiment, $H_2$ gas is supplied to the chamber at a flow rate of about 4 standard liters per minute. In a specific embodiment, cathode layer 42 is exposed to the $H_2$ plasma for a period of two to seven minutes, and the $H_2$ gas is delivered to the chamber at a flow rate of about one to six liters per minute.

After cathode layer 42 has been subjected to an $H_2$ plasma, one or more encapsulation layers (FIG. 1, element 44; FIG. 2, elements 208, 210) are optionally deposited onto the organic electroluminescent device. These encapsulation layers protect the device from exposure to the elements, such as moisture, and prolong device lifetime. More details on suitable encapsulation layers are disclosed below in relation to other aspects of the present invention.

5.2 Organic Electroluminescent Devices Manufactured using an $H_2$ Plasma

The manufacturing steps for making an organic electroluminescent device 200 in accordance with the present invention have been disclosed. Accordingly, one aspect of the present invention provides an organic electroluminescent device 200 comprising a substrate 32, an anode layer 34 on the substrate 32, an organic layer 204 on the anode layer 34, a cathode layer 42 on the organic layer 204, and, optionally, one or more protective layers (encapsulation layer) on the cathode layer. In this aspect of the invention, the cathode layer 42 is subjected to an $H_2$ plasma prior to deposition of the one or more protective layers. In some embodiments, cathode layer 42 is overlayed with a protective covering such as an aluminum casing. In such embodiments, the protective covering is subjected with and $H_2$ plasma and one or more protective layers (encapsulation layers) are overlayed on the protective covering. Representative protective layers include, but are not limited to, silicon nitride layers. Further, in some embodiments, organic layer 204 is deposited on cathode layer 42 by PECVD, atmospheric pressure CVD, sputtering, or spin-coating. In some embodiments, cathode layer 42 is subjected to an $H_2$ plasma prior to deposition of one or more protective layers in a PECVD chamber by exposing cathode layer 42 to an $H_2$ plasma for a period of up to ten minutes. In other embodiments, cathode layer 42 is exposed to the $H_2$ plasma for a period of four minutes to seven minutes.

5.3 Process Methods for Multilayer Encapsulation of Organic Electroluminescent Devices A second aspect of the present invention provides novel methods for encapsulating organic electroluminescent devices, such as organic light-emitting diodes or polymer light-emitting diodes. This second aspect of the present invention will be described with reference to FIG. 2. In this aspect of the invention, one or more first encapsulation layers 208 (FIG. 2) are designed to adhere to cathode layer 42. Next, one or more second encapsulation layers 210 are optimized to provide additional moisture protection to the device. In some embodiments, cathode layer 42 is subjected to an $H_2$ plasma using the techniques described in Section 5.1, above, prior to deposition of first and second encapsulation layers. In some embodiments, cathode layer 42 is overlayed with a protective coating, such as an aluminum coating. In such embodiments, the protective coating is optionally subjected to an $H_2$ plasma using the techniques described in Section 5.1, above, prior to deposition of first and second encapsulation layers.

Some embodiments in accordance with this aspect of the invention provide methods for encapsulating an organic electroluminescent device 200 having a cathode layer 42. One such method comprises (A) depositing an inner encapsulation layer 208 over cathode layer 42 and (B) depositing outer encapsulation layer 210 over inner encapsulation layer 208. In some embodiments, inner encapsulation layer 208 and outer encapsulation layer 210 have the same physical properties. In other embodiments, inner encapsulation layer 208 is optimized for adhesion to cathode layer 42 and outer encapsulation layer 210 provides additional moisture protection to device 200. In some embodiments, inner encapsulation layer 208 is optimized for adhesion to cathode layer 42 when encapsulation layer 208 adheres to cathode layer 42 without peeling.

5.3.1 The Inner Encapsulation Layer

In some embodiments, inner encapsulation layer is a silicon rich silicon nitride film. It has been determined that silicon rich silicon nitride films have suitable adhesion properties. Silicon rich silicon nitride films have a higher silicon content then standard silicon nitride films. Because of this higher silicon content, silicon rich silicon nitride films have an index of refraction that is higher than standard silicon nitride films. Standard silicon nitride films have an index of refraction of about 1.8 to 1.9. In contrast, silicon rich silicon nitride films have an index of refraction of about 1.95 or greater. Accordingly, in one embodiment of the present invention, one exemplary inner encapsulation layer 208 that is optimized for adhesion to cathode layer 42 is a silicon nitride film having a refractive index of about 1.95 or greater.

In some embodiments of the present invention, inner encapsulation layer 208 has a thickness of about 0.5 μM to about 2.5 μM. This thickness is desired in order to completely cover any features (e.g., roughness) found in underlying cathode layer 42. In organic electroluminescent devices in which the cathode layer 42 is very smooth, thinner encapsulation layer(s) 208 can be used.

Encapsulating an organic electroluminescent device with a silicon rich silicon nitride film is typically performed under specific process conditions because most materials used in organic layer 204 (FIG. 2) are temperature sensitive. In fact, materials that are commonly used in organic layer 204 cannot withstand sustained temperatures exceeding 100° C. Yet 100° C. is a very low process temperature for deposition of silicon nitride using PECVD. Nevertheless, the present invention provides process conditions for deposition of a silicon rich silicon nitride encapsulation layer onto a temperature sensitive organic electroluminescent device using a PECVD chamber such as the AKT PECVD 1600 B version (4×5) (Applied Materials, Santa Clara, Calif.). These process conditions include pressure, power, substrate spacing, temperature, deposition rate, and relative gas flows.

To achieve a silicon rich silicon nitride film, the pressure during deposition of the film is about 1.0 Torr to about 1.4 Torr. Deposition of the film typically occurs in a PECVD deposition chamber. The power used in the PECVD chamber during at least a portion of the deposition of the silicon rich silicon nitride film is about $C_1 \times 1500$ watts to about $C_1 \times 2500$ watts, where $C_1$=[size of the PECVD susceptor/200,000 mm$^2$]. Thus, if susceptor size 318 (FIG. 3) is 200,000 mm$^2$, $C_1$ has the value "1" and the power is about 1500 watts to about 2500 watts during a portion of the deposition of the silicon rich silicon nitride encapsulation film.

The process parameter "substrate spacing" refers to the distance between substrate 38 (FIG. 3) and showerhead 316 (FIG. 3). In general, in a AKT PECVD 1600 B version (400 mm×500 mm), the substrate spacing may be adjusted so that it is anywhere between 400 mils and 2000 mils (1 cm to 5 cm). The exact substrate spacing adopted for any particular silicon rich silicon nitride film deposition is application dependent as well as deposition chamber dependent and therefore must be optimized on a trial and error basis for any given organic electroluminescent device.

As described above, the temperature of the PECVD chamber during deposition of the silicon rich silicon nitride film is constrained by the physical characteristics of the material used to make organic layer 204. Because many organic electroluminescent devices cannot tolerate temperatures in excess of 100° C., silicon rich silicon nitride deposition is constrained to process temperatures that do not exceed 100° C. in many embodiments of the present invention. Because of the large amount of power used in the process conditions of the present invention ($C_1 \times 1500$ watts to about $C_1 \times 2500$ watts), susceptor 318 does not have to be heated in order to achieve the desired process temperature in some embodiments of the invention. The desired process temperature is one that approaches the maximum temperature tolerance of organic layer 204. More typically, the power density applied to showerhead (first electrode) causes the temperature of substrate 32 to exceed 100° C. without heating susceptor 318. This problem is addressed in one embodiment of the present invention by cycling between active periods, in which a silicon nitride film is deposited onto organic layer 204 and inactive periods in which the organic electroluminescent device is allowed to cool. This embodiment is described in more detail below.

In some embodiments of the present invention, the inner encapsulation layer 208 is deposited at a deposition rate of about 0.2 μM per minute to about 0.4 μM per minute. In one embodiment of the present invention, the inner encapsulation layer 208 is deposited at a deposition rate of about 0.3 μM per minute.

Typically, a silicon nitride film is deposited in a PECVD or CVD chamber by introducing silane gas, ammonia gas, nitrogen gas, and hydrogen gas into the PECVD or CVD chamber at controlled rates. The relative gas flow rates of each of these gases ultimately determines the properties of the silicon nitride film. It is known in the art that a silicon rich silicon nitride film is achieved by reducing the ammonia gas flow rate. Using the AKT PECVD 1600 B version (substrate size 400 mm×500 mm) as benchmark, the relative gas flow of silane to ammonia for a standard (not silicon rich) silicon nitride film is 1:5 (relative units) (Si:NH$_3$). In other PECVD chambers, the relative gas flow of silane to ammonia is 1:6, 1:7, 1:8, or even lower ratios of silane to ammonia, such as 1:10. In contrast to standard silicon nitride films, a silicon rich silicon nitride film is produced by setting the gas flow of ammonia in the PECVD 1600 B to less than five relative units. As defined herein, a "relative unit" is the gas flow rate of silane into the PECVD chamber during silicon nitride deposition. In some embodiments, no ammonia or hydrogen is used during deposition of the silicon rich silicon nitride film. Depletion of ammonia from the PECVD chamber leaves N$_2$ gas as the only source of nitrogen ions. Because the disassociation energy for N$_2$ gas is much higher than the disassociation energy for ammonia, high power densities, as described above, are required in order to obtain nitrogen radicals, which are necessary in order to form a silicon nitride film.

In one embodiment of the present invention, the flow rates used during deposition of the silicon rich silicon nitride films are as follows:

| | |
|---|---|
| silane gas | 1 relative unit |
| ammonia gas | less than five relative units |
| nitrogen gas | at least five relative units |

In a specific embodiment, the flow rate of silane gas is 500 standard cubic centimeters per minute (sccm). Therefore, in this example, a relative unit is defined as 500 sccm. Further, in this example, the flow rate of ammonia gas is less than 2500 sccm and the flow rate of nitrogen gas is at least 2500 sccm. In a preferred embodiment, the flow rate of silane is 1 relative unit, the flow rate of nitrogen gas is 19 relative units, and no ammonia gas is used in order to form the silicon rich silicon nitride film. In another embodiment, the flow rate of ammonia gas into the PECVD chamber is less than one relative unit where, again, a relative unit is defined as the flow rate of silane gas.

In yet another specific embodiment, the flow rate of silane gas is one relative unit, the flow rate of nitrogen gas is 19 relative units, and no hydrogen gas or ammonia gas is used during deposition of the silicon rich silicon nitride film. In this specific embodiment, the AKT PECVCD 1600 B version (substrate size 400 mm×500 mm) (Applied Materials, Santa Clara, Calif.) is used. The power during deposition is 1800 watts, the pressure is set to 1.2 Torr, and the susceptor spacing is 962 mils (2.44 cm).

5.3.2 The Outer encapsulation Layer

In some embodiments of the present invention, outer encapsulation layer 210 has the same physical properties as inner encapsulation layer 208. In fact, in some embodiments, there are more than two encapsulation layers. Without intended to be limited to any particular theory, it is believed that multiple encapsulation layers are beneficial in some embodiments because any pinhole that forms in one of the component encapsulation layers will not destroy the seal provided by the plurality of encapsulation layers. Even in the case where a first pinhole forms in inner encapsulation layer 208 and a second pinhole forms in outer encapsulation layer 210, the seal provided by the combined inner and outer encapsulation layers is not broken. This is because the probability that the first pinhole in inner encapsulation layer 208 and the second pinhole in outer encapsulation layer 210 line up at the same point is simply too remote. Thus, in some embodiments of the present invention, each encapsulation layer has the same or similar properties.

In some embodiments, outer encapsulation layer 210 may have different properties than inner encapsulation layer 208. For example, in some embodiments, outer encapsulation layer 210 is not a silicon rich silicon nitride film. In some embodiments, inner encapsulation layer 208 and/or outer encapsulation layer 210 has a low wet etch rate. In one embodiment, inner encapsulation layer 208 and/or outer encapsulation layer 210 is a silicon nitride layer having a wet etch rate in the range of about 0.27 μM per minute to about 0.33 μM per minute as determined by a buffered oxide etchant 6:1 assay. Buffered oxide etchant 6:1 includes ammonium hydrogen fluoride, ammonium fluoride, and water and is commercially available from sources such as Air Products Electronic Chemicals, Carlsbad, Calif. As is well known in the art, a buffered oxide etchant 6:1 assay measures the etch rate of a silicon nitride layer. In the assay, the thickness of a silicon nitride wafer is measured before and after immersing the wafer in buffered oxide etchant 6:1 for a controlled period of time. In some embodiments of the present invention, inner encapsulation layer and/or outer encapsulation layer 210 has a low wet etch rate of about 0.3 μM per minute.

Although silicon oxide processes run at conventional temperatures yield wet etch rates that are much lower than 0.3 μM per minute, it is typically not possible to deposit outer encapsulation layer 210 using conventional temperatures because of the temperature sensitivity of organic layer 204. More typically, the deposition temperature is constrained to sustained temperatures that do not exceed 100° C. For a layer deposited under such temperature constraints, a wet etch rate of 0.27 μM per minute to about 0.33 μM per minute is considered a low wet etch rate. In some embodiments, outer encapsulation layer 210 has a refractive index of about 1.90 or less. In some embodiments, outer encapsulation layer 210 has a thickness of about 0.07 μM to about 0.22 μM.

The present invention provides process conditions for deposition of the outer encapsulation layer onto the inner encapsulation layer. These process conditions include pressure, power, substrate spacing, temperature, deposition rate, and relative gas flows. In some embodiments of the invention, deposition of inner encapsulation layer and/or outer encapsulation layer 210 is performed in a PECVD chamber or a CVD chamber at a pressure of about 0.7 Torr to about 0.9 Torr. In some embodiments, the power requirements for deposition of outer encapsulation layer 210 are considerably less than those needed for inner encapsulation layer 208. In some embodiments of the present invention, deposition of outer encapsulation layer 210 is performed in a PECVD chamber and the power in the PECVD chamber during at least a portion of this deposition is about $C_1 \times 700$ watts to about $C_1 \times 900$ watts, where $C_1 =$ [size of the PECVD susceptor/200,000 mm²].

In some embodiments, an AKT PECVD 1600 B version (substrate size 400 mm×500 mm) is used to perform the deposition of outer layer 210. In such embodiments, substrate spacing is adjusted so that it is anywhere between 400 mils and 2000 mils (1 cm to 5 cm). The exact substrate spacing adopted for any particular deposition of outer film 210 is application dependent and therefore is often optimized on a trial and error optimization basis for any given organic electroluminescent device. In one embodiment, the substrate spacing during deposition of outer layer 210 is 900 mils (2.29 cm).

Because of the temperature sensitivity of the organic layer 204 in organic electroluminescent device 200, the temperature during deposition of outer encapsulation layer 210 is constrained by the physical limitations of an organic layer in the organic electroluminescent device. In some embodiments, deposition of outer encapsulation layer 210 is performed at sustained temperatures that do not exceed 100° C. Typically, the power requirements for deposition of outer encapsulation layer 210 are considerably less than those needed for inner encapsulation layer 208. Because of the reduced power requirements, substrate 32 heating does not typically present the same problem that arises during deposition of inner encapsulation layer 208. Therefore, deposition of outer layer 210 typically does not have to be interrupted by periods of cooling.

In some embodiments of the present invention, outer encapsulation layer 210 is deposited at a deposition rate of about 0.025 μM per minute to about 0.08 μM per minute. In one embodiment of the present invention, outer encapsulation layer is deposited at a deposition rate of about 0.05 μM per minute.

As described above, a silicon nitride film is deposited in a PECVD or CVD chamber by introducing silane gas, ammonia gas, nitrogen gas, and hydrogen gas into the PECVD or CVD chamber at controlled rates. The relative gas flow rates of each of these gases ultimately determines the properties of the silicon nitride film. In one embodiment of the present invention, the relative gas flow rates used to make outer encapsulation layer 210 are one relative unit of silane gas, two relative units or greater of ammonia gas, five relative units or greater of nitrogen gas, and ten units or greater of hydrogen gas.

In some embodiments inner encapsulation layer 208 and/ or outer encapsulation layer 210 has a water transmission rate that is less than the limit of MOCON (Minneapolis, Minn.) detection instruments, such as the MOCON 3/31 or 3/60 (e.g., $5 \times 10^{-3}$ g/m$^2$/day at about 25° C. or about 38° C.).

In yet another specific embodiment, the flow rate of silane gas is one relative unit, the flow rate of nitrogen gas is three relative units, the flow rate of nitrogen gas is 1.5 relative units, and the flow rate for hydrogen gas is 40 relative units. In this specific embodiment, the AKT PECVCD 1600 B version (substrate size 400 mm×500 mm) (Applied Materials, Santa Clara, Calif.) is used. The power during deposition is 800 watts, the pressure during deposition is set to 0.8 Torr, and the susceptor spacing is 900 mils (2.29 cm).

5.3.3 Cycled Deposition to Control Substrate Temperature

Because of the sensitivity of organic electroluminescent devices (e.g., OLEDs) to temperature, overheating the substrate during processing can compromise both the integrity of the encapsulation film and the device itself. Even using low temperature processing techniques, the substrate temperature can increase substantially. This is particularly the case during deposition of inner encapsulation layer 208, which typically requires a very high power density. Without being limited to any particular theory, it is believed that the substrate stores thermal energy from the high powered deposition process used for depositing encapsulation layer 208. This stored thermal energy causes the substrate temperature to rise even in instances where susceptor 318 is not heated.

One aspect of the present invention addresses the substrate temperature problem. This aspect of the invention provides a method of depositing inner encapsulation layer 208 using a PECVD or CVD chamber. Generally, the inventive deposition method comprises iterations between an active period in which power is applied to the deposition chamber and a cooling period where reduced or no power is applied to the deposition chamber. During the cooling period, deposition gas flows are reduced or eliminated. In fact, in some embodiments, a cooling gas flow, such as a hydrogen gas flow, is applied.

In some embodiments, the pressure in the deposition chamber is different during at least a portion of the cooling period, from the pressure in the deposition chamber during the active period. In some embodiments, the susceptor spacing in the deposition chamber is increased during at least a portion of the cooling period relative to the susceptor spacing in the deposition chamber during at least a portion of the active period.

Now that the general features of this aspect of the invention have been described, more detailed embodiments will be presented. In one embodiment of the present invention, the inventive deposition process takes place in a PECVD chamber. In this embodiment, the deposition method comprises iterations of:

(i) an active step in which the power in the PECVD chamber is about $C_1 \times 1500$ watts to about $C_1 \times 2500$ watts, where $C_1$=[size of the PECVD susceptor/200,000 mm$^2$] and the flow rate of silane gas into the PECVD chamber is one relative unit, the flow rate of ammonia gas into the PECVD chamber is less than five relative units, and the flow rate of nitrogen gas into the PECVD chamber is at least five relative units; and (ii) a cooling step in which the power in the PECVD chamber is less than $C_1 \times 1500$ watts. A relative unit refers to the flow rate of silane gas at any give time.

In some embodiments, active step (i) and cooling step (ii) are repeated five or more times during deposition of inner encapsulation layer 208. In some embodiments, each instance of the active step has a duration of about 5 to about 20 seconds and each instance of said cooling step has a duration of about 5 seconds or more. Other time intervals are possible and all such time intervals are within the scope of the present invention. For instance, active step could be between 4 and 12 seconds, 8 and 16 seconds, 3 and 40 seconds and the cooling step could be 1 second, 3 seconds, 10 seconds, 30 seconds, one minute, or longer.

5.4 Multilayer Encapsulated Electroluminescent Devices

The manufacturing steps for encapsulating organic electroluminescent devices have been disclosed. Referring to FIG. 2, one aspect of the present invention provides an organic electroluminescent device having a substrate 32, an anode layer 34 on the substrate 32, an organic layer 204 on the anode layer 34, a cathode layer 42 on the organic layer 204, an inner encapsulation layer 208 on the cathode layer 42, and an outer encapsulation layer 210 on the inner encapsulation layer. In some embodiments, inner encapsulation layer 208 and outer encapsulation layer 210 have the same or similar properties. In other embodiments, inner encapsulation layer 208 is optimized for adhesion to the cathode layer 42. While FIG. 2 shows just one inner encapsulation layer 208 and just one outer encapsulation layer 210, there may, in fact, be more than one inner encapsulation layer 208 and/or more than one outer encapsulation layer 210.

In some embodiments, inner encapsulation layer 208 is a silicon rich silicon nitride film having a refractive index of about 1.95 or greater. In some embodiments, outer encapsulation layer 210 is a silicon nitride film having a refractive index of about 1.90 or less. In some embodiments, inner encapsulation layer and/or outer encapsulation layer has a water transmission rate of less than $5 \times 10^{-3}$ g/m$^2$ day at about 25° C. or about 38° C. In some embodiments, anode layer 34 is made of indium tin oxide (ITO), tin oxide, electrically conductive carbon, a $\pi$-conjugated polymer, or a mixture thereof. In some embodiments, the $\pi$-conjugated polymer is polyaniline or polypyrrole. In some embodiments, organic layer 204 includes a hole transport material. The hole transport material, in some exemplary embodiments, comprises polyaniline, polypyrrole, poly(phenylene vinylene), a porphyrin derivative, copper phthalocyanine, copper tetramethyl phthalocyanine, zinc phthalocyanine, titanium oxide phthalocyanine, magnesium phthalocyanine, an aromatic tertiary amine, a polynuclear aromatic amine, or a mixture thereof.

6. Alternate Embodiments and References Cited

All references cited herein are incorporated herein by reference in their entirety and for all purposes to the same extent as if each individual publication or patent or patent application was specifically and individually indicated to be incorporated by reference in its entirety for all purposes. While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

What is claimed is:

1. A method of fabricating an organic electroluminescent device comprising:
   depositing an anode material on a substrate to form an anode layer;
   depositing an organic layer on said anode layer;
   depositing a cathode layer on said organic layer; and
   subjecting said cathode layer to an $H_2$ plasma,
   wherein said subjecting step is performed in a plasma enhanced chemical vapor deposition (PECVD) chamber by exposing said cathode layer to said $H_2$ plasma for a period of up to ten minutes.

2. A method of fabricating an organic electroluminescent device comprising:
   depositing an anode material on a substrate to form an anode layer;
   depositing an organic layer on said anode layer;
   depositing a cathode layer on said organic layer; and
   subjecting said cathode layer to an $H_2$ plasma,
   wherein said subjecting step is performed in a plasma enhanced chemical vapor deposition (PECVD) chamber by exposing said cathode layer to said $H_2$ plasma for a period of four minutes to seven minutes.

3. The method of claim 2, wherein the RF power of the PECVD chamber during at least a portion of said exposing step is between about 0.025 watts/cm$^2$ and about 0.5 watts/cm$^2$.

4. The method of claim 2, wherein the pressure of said PECVD chamber during at least a portion of said exposing step is between about 0.3 Torr and about 1 Torr.

5. The method of claim 2, wherein said $H_2$ gas is supplied to said PECVD chamber at a flow rate of about 100 standard cubic centimeters per minute to about 10 standard liters per minute during at least a portion of said exposing step.

6. A method of fabricating an organic electroluminescent device comprising:
   depositing an anode material on a substrate to form an anode layer;
   depositing an organic layer on said anode layer;
   depositing a cathode layer on said organic layer; and
   subjecting said cathode layer to an $H_2$ plasma,
   wherein said subjecting step is performed in a PECVD chamber by exposing said cathode layer to said $H_2$ plasma for a period of two to seven minutes, and wherein $H_2$ gas is delivered to said PECVD chamber at a flow rate of about one to six liters per minute during at least a portion of said exposing step.

7. A method of encapsulating an organic electroluminescent device comprising:
   (A) depositing an inner encapsulation layer over a cathode layer, wherein said inner encapsulation layer adheres to said cathode layer; and
   (B) depositing an outer encapsulation layer over said inner encapsulation layer,
   wherein said depositing step (A) is performed in a plasma enhanced chemical vapor deposition (PECVD) chamber or a chemical vapor deposition (CVD) chamber having a susceptor, and wherein the pressure in said PECVD or CVD chamber during at least a portion of said depositing step (A) is about 1.0 Torr to about 1.4 Torr.

8. A method of encapsulating an organic electroluminescent device comprising:
   (A) depositing an inner encapsulation layer over a cathode layer, wherein said inner encapsulation layer adheres to said cathode layer; and
   (B) depositing an outer encapsulation layer over said inner encapsulation layer,
   wherein said depositing step (A) is performed in a PECVD chamber having a susceptor and wherein the power in said PECVD chamber during at least a portion of said depositing step (A) is about $C_1 \times 1500$ watts to about $C_1 \times 2500$ watts, where $C_1$ = [size of the PECVD susceptor/200,000 mm$^2$].

9. A method of encapsulating an organic electroluminescent device comprising:
   (A) depositing an inner encapsulation layer over a cathode layer, wherein said inner encapsulation layer adheres to said cathode layer; and
   (B) depositing an outer encapsulation layer over said inner encapsulation layer,
   wherein said depositing step (A) is performed in a PECVD chamber and wherein:
   a flow rate of silane gas into said PECVD chamber during at least a portion of said depositing step (A) is one relative unit;
   a flow rate of ammonia gas into said PECVD chamber during at least a portion of said depositing step (A) is less than five relative units; and
   a flow rate of nitrogen gas into said PECVD chamber during at least a portion of said depositing step (A) is at least five relative units.

10. The method of claim 9 wherein the flow rate of ammonia gas into said PECVD chamber during at least a portion of said depositing step (A) is less than one relative unit.

11. A method of encapsulating an organic electroluminescent device comprising:
    (A) depositing an inner encapsulation layer over a cathode layer, wherein said inner encapsulation layer adheres to said cathode layer; and
    (B) depositing an outer encapsulation layer over said inner encapsulation layer,
    wherein said depositing step (B) is performed in a plasma enhanced chemical vapor deposition (PECVD) chamber or a chemical vapor deposition (CVD) chamber, and wherein the pressure in said PECVD or CVD chamber during at least a portion of said depositing step (B) is about 0.7 Torr to about 0.9 Torr.

12. A method of encapsulating an organic electroluminescent device comprising:
    (A) depositing an inner encapsulation layer over a cathode layer, wherein said inner encapsulation layer adheres to said cathode layer; and
    (B) depositing an outer encapsulation layer over said inner encapsulation layer,
    wherein said depositing step (B) is performed in a plasma enhanced chemical vapor deposition (PECVD) chamber having a susceptor and wherein the power in said PECVD chamber during at least a portion of said depositing step (B) is about $C_1 \times 700$ watts to about $C_1 \times 900$ watts, where $C_1$=[size of the PECVD susceptor/200,000 mm$^2$].

13. A method of encapsulating an organic electroluminescent device comprising:
(A) depositing an inner encapsulation layer over a cathode layer, wherein said inner encapsulation layer adheres to said cathode layer; and
(B) depositing an outer encapsulation layer over said inner encapsulation layer,
wherein said depositing step (B) is performed in a plasma enhanced chemical vapor deposition (PECVD) chamber and wherein
the flow rate of silane gas into said PECVD chamber during at least a portion of said depositing step (B) is one relative unit;
the flow rate of ammonia gas into said PECVD chamber during at least a portion of said depositing step (B) is two relative units or greater;
the flow rate of nitrogen gas into said PECVD chamber during at least a portion of said depositing step (B) is at least five relative units; and
the flow rate of hydrogen gas into said PECVD chamber during at least a portion of said depositing step (B) is at least ten relative units.

14. A method of encapsulating an organic electroluminescent device comprising:
(A) depositing an inner encapsulation layer over a cathode layer, wherein said inner encapsulation layer adheres to said cathode layer; and
(B) depositing an outer encapsulation layer over said inner encapsulation layer,
wherein said depositing of said inner encapsulation layer is performed in a plasma enhanced chemical vapor deposition (PECVD) chamber having a susceptor and wherein said depositing step (A) further comprises at least one iteration of:
(i) an active step in which the power in said PECVD chamber is about $C_1 \times 1500$ watts to about $C_1 \times 2500$ watts, where $C_1$=[size of the PECVD susceptor/200,000 mm$^2$] and a flow rate of silane gas into said PECVD chamber is one relative unit, a flow rate of ammonia gas into said PECVD chamber is less than five relative units, and a flow rate of nitrogen gas into said PECVD chamber is at least five relative units; and
(ii) a cooling step in which the power in said PECVD chamber is less than $C_1 \times 1500$ watts.

15. The method of claim 14 wherein the respective flow rates of silane gas, ammonia gas, and nitrogen gas is reduced in said cooling step relative to the corresponding flow rates of silane gas, ammonia gas, and nitrogen gas in said active step.

16. The method of claim 15 wherein a coolant gas is introduced into said PECVD chamber during at least a portion of said cooling step.

17. The method of claim 16 wherein said coolant gas is $H_2$.

18. The method of claim 14 wherein there is no flow of silane gas, ammonia gas, or nitrogen gas into said PECVD chamber during at least a portion of said cooling step.

19. The method of claim 14 wherein the pressure in said PECVD chamber is different during at least a portion of said cooling step from the pressure in said PECVD chamber during said active step.

20. The method of claim 14 wherein the susceptor spacing in said PECVD chamber is increased during at least a portion of said cooling step relative to the susceptor spacing in said PECVD chamber during at least a portion of said active step.

21. The method of claim 14 wherein said depositing step (A) further comprises five or more iterations of said active step and said cooling step.

22. The method of claim 14 wherein each instance of said active step has a duration of about 5 to about 20 seconds and each instance of said cooling step has a duration of about 5 seconds or more.

23. The method of claim 14 wherein said inner encapsulation layer has a thickness of about 0.5 to about 2.5.

24. The method of claim 14 wherein said outer encapsulation layer has a thickness of about 0.07 to about 0.22.

25. A method of fabricating an organic electroluminescent device, comprising:
providing a substrate having an anode layer overlying said substrate surface, an organic layer overlying said anode layer, and a cathode layer overlying said organic layer;
contacting said cathode layer with an $H_2$ plasma; and
applying a protective coating over said cathode layer subsequent to said contacting with said $H_2$ plasma.

26. A method in accordance with claim 25, wherein said cathode layer is a bilayer which includes both a layer of a low work function metal having a work function below about 4.0 eV and a layer of a high work function metal having a work function between about 4.0 eV and about 6.0 eV.

27. A method in accordance with claim 25, wherein an upper layer of said bilayer, which upper layer forms an upper surface on said cathode, and which is contacted with said $H_2$ plasma, is a high work function metal.

28. A method in accordance with claim 25, wherein said upper layer of said bilayer is aluminum.

29. A method in accordance with claim 27, wherein said lower layer of said bilayer is a low work function material selected from the group consisting of lithium, magnesium, calcium, beryllium, barium, scandium, yttrium, lanthanum, cerium, europium, and actinium.

* * * * *

UNITED STATES PATENT AND TRADEMARK OFFICE
CERTIFICATE OF CORRECTION

PATENT NO. : 7,086,918 B2  Page 1 of 1
APPLICATION NO. : 10/317774
DATED : August 8, 2006
INVENTOR(S) : Mark Hsiao et al.

It is certified that error appears in the above-identified patent and that said Letters Patent is hereby corrected as shown below:

Col. 20, Line 25-26,
Claim 23 should read: "The method of Claim 14 wherein said inner encapsulation layer has a thickness of about 0.5 to about 2.5 µm."

Col. 20, Line 27-28,
Claim 24 should read: "The method of Claim 14 wherein said outer encapsulation layer has a thickness of about 0.07 to about 0.22 µm."

Signed and Sealed this

Second Day of June, 2009

JOHN DOLL
*Acting Director of the United States Patent and Trademark Office*